United States Patent
Niitsuma

Patent Number: 5,136,266
Date of Patent: Aug. 4, 1992

[54] SURFACE ACOUSTIC WAVE DEVICE HAVING STAGGERED DISPERSIVE DELAY TRANSDUCERS

[75] Inventor: Teruo Niitsuma, Tokyo, Japan

[73] Assignee: Clarion Co., Ltd., Tokyo, Japan

[21] Appl. No.: 466,243

[22] Filed: Jan. 17, 1990

[30] Foreign Application Priority Data

Jan. 17, 1989 [JP] Japan .................................... 1-9368

[51] Int. Cl.⁵ ............................................ H03H 9/44
[52] U.S. Cl. .................................... 333/154; 333/196; 310/313 B; 310/313 C
[58] Field of Search .............................. 333/150–154, 333/193–196; 310/313 R, 313 B, 313 C, 313 D

[56] References Cited

U.S. PATENT DOCUMENTS

| | | | |
|---|---|---|---|
| 4,160,219 | 7/1979 | Kuny | 310/313 C X |
| 4,217,563 | 8/1980 | Vale | 333/150 |
| 4,224,683 | 9/1980 | Adkins | 333/150 X |
| 4,390,807 | 6/1983 | Kishimoto et al. | 333/154 X |
| 4,390,854 | 6/1983 | Colvin | 333/193 |
| 4,462,011 | 7/1984 | Ward | 333/154 |
| 4,583,047 | 4/1986 | LeGroff et al. | 333/193 X |
| 4,746,882 | 5/1988 | Solie | 333/154 X |

FOREIGN PATENT DOCUMENTS

| | | | |
|---|---|---|---|
| 2029723 | 1/1971 | Fed. Rep. of Germany | 333/150 |
| 2132985 | 4/1980 | Fed. Rep. of Germany | 333/151 |
| 1056428 | 11/1983 | U.S.S.R. | 333/151 |

*Primary Examiner*—Eugene R. Laroche
*Assistant Examiner*—Benny Lee
*Attorney, Agent, or Firm*—Wallenstein, Wagner & Hattis, Ltd.

[57] ABSTRACT

A dispersive surface acoustic wave delay line device consists of a plurality of delay line elements which are disposed parallely so that a propagating path of a delay line element is not co-owned by the other delay line elements, in order to reduce secondary effects caused by electrode fingers.

6 Claims, 4 Drawing Sheets

SURFACE ACOUSTIC WAVE DEVICE HAVING STAGGERED DISPERSIVE DELAY TRANSDUCERS

FIELD OF THE INVENTION

This invention relates to a surface acoustic wave device, and more particularly to an improvement of a delay line device using dispersion type surface acoustic wave transducers.

BACKGROUND OF THE INVENTION

A delay line device shown in FIG. 5, one of the most basic existing arrangements using dispersion type surface acoustic wave transducers (chirp transducers) formed on a surface acoustic wave substrate 1 is practically used in a high-speed analog Fourier transformer for use in a real time spectrum analyzer or in a pulse expanding/compressing apparatus for use in a chirp radar. It usually has a wide-band property and a large delay time for purposes of improving the processing capacity and the resolving power. The substrate 1 is in the form of a monocrystal piezoelectric substrate such as lithium niobate, lithium tantalate, etc. or a multi-layer piezoelectric substrate such as AlN/sapphire, ZnO/Si, ZnO/SiO$_2$/Si. The arrow mark in FIG. 5 indicates the propagating direction of a surface acoustic wave.

Since the chirp transducers of the above-indicated delay line device have a large number of electrodes and a surface acoustic wave passes under a large number of electrode fingers before exiting from the transducer end, a large loss caused by internal reflections in the transducers themselves or mode transformation into a bulk wave deteriorate the characteristic of the device.

Particularly when the bands of the chirp transducers include sets of frequencies F$_1$ and F$_2$ in the relationship of f$_2$=2f$_1$, deterioration of the characteristic by their effects cannot be disregarded. Further, a change in the sonic speed by the large number of electrodes on the propagation path causes a turbulence in the group delay and the phase characteristic.

FIG. 6 shows chirp transducers having a generally called slanted electrode arrangement in which the propagation path of an excited surface acoustic wave is gradually moved in a direction across the propagation direction, depending on the frequency of the surface acoustic wave, so as to substantially decrease the number of electrode fingers, for purposes of reducing influence of internal reflections inside the transducer and mode transform.

The above type transducers suppress the influence of internal reflections inside the transducer and mode transformation into a bulk wave and realize a good characteristic of the device. However, since the minimum size of the interdigitating width of the electrode fingers is limited and the entire electrode width in the vertical direction with respect to the surface wave propagating direction is therefore increased in order to prevent an increase in the loss caused by diffraction of a surface acoustic wave radiated from a narrow opening, the manufacturing cost per surface acoustic wave element is increased. Further, when it is used in a dispersive substrate, the design for correcting the group delay and the phase characteristic over a wide band in a single transducer is a difficult technology even with the slanted electrode arrangement.

OBJECT OF THE INVENTION

It is therefore a main object of the invention to provide a chirp transducer eliminating the above-indicated drawbacks of the existing arrangement and suppressing the dimensional increase of the element.

SUMMARY OF THE INVENTION

In order to overcome the above-indicated problems, a first invention is so arranged that dispersive delay line elements whose inputs and outputs are dispersive surface acoustic wave transducers are disposed in a parallel alignment without sharping their propagation paths, and respective inputs of all the delay lines and respective outputs thereof are electrically connected, respectively.

A second invention is so arranged that dispersive delay line elements whose inputs and outputs are a dispersive surface acoustic wave transducer and a non-dispersive surface acoustic wave transducer are disposed in parallel alignment without sharping their propagation paths, and respective inputs of all the delay lines and respective outputs thereof are electrically connected, respectively.

In each such dispersive surface acoustic wave delay line device, a desired continuous frequency characteristic is obtained by the arrangement where a plurality of delay line elements whose respective frequency characteristics are involved in a desired characteristic are connected in parallel and so that they do no share common propagation path.

DETAILED DESCRIPTION

Figure 1:
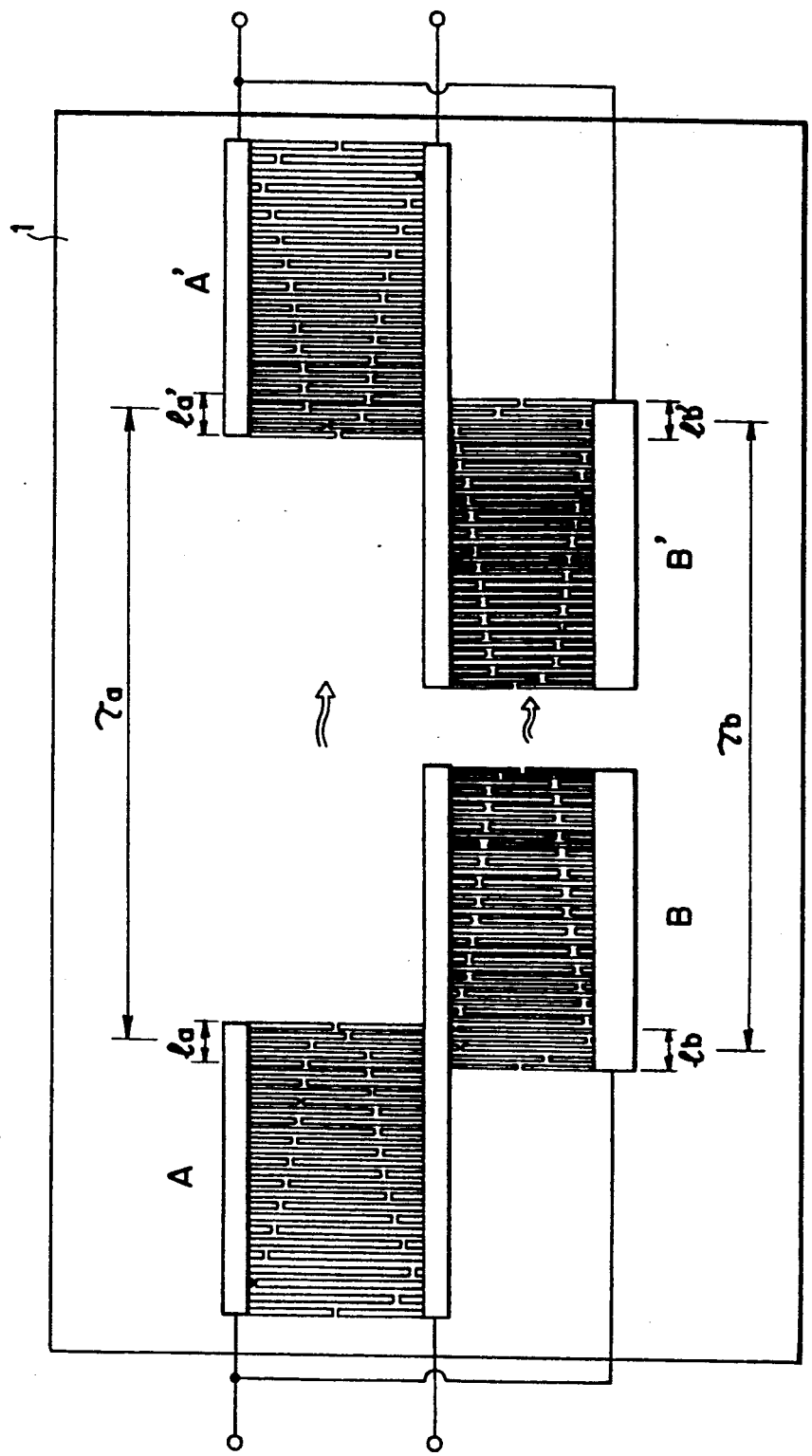
FIG. 1 is a fragmentary plan view of a dispersive surface acoustic wave delay line device embodying the invention.
Figure 5:
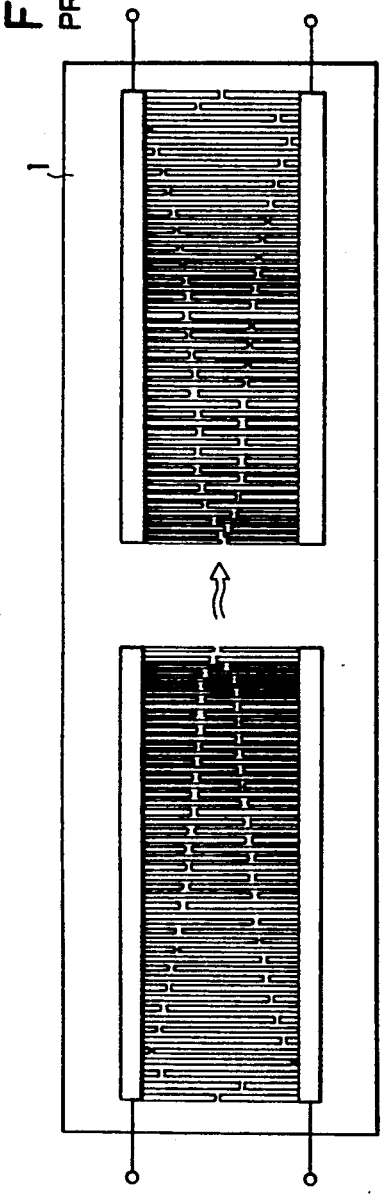
FIG. 5 is a fragmentary plan view of an existing dispersive surface acoustic wave delay line device.
Figure 6:
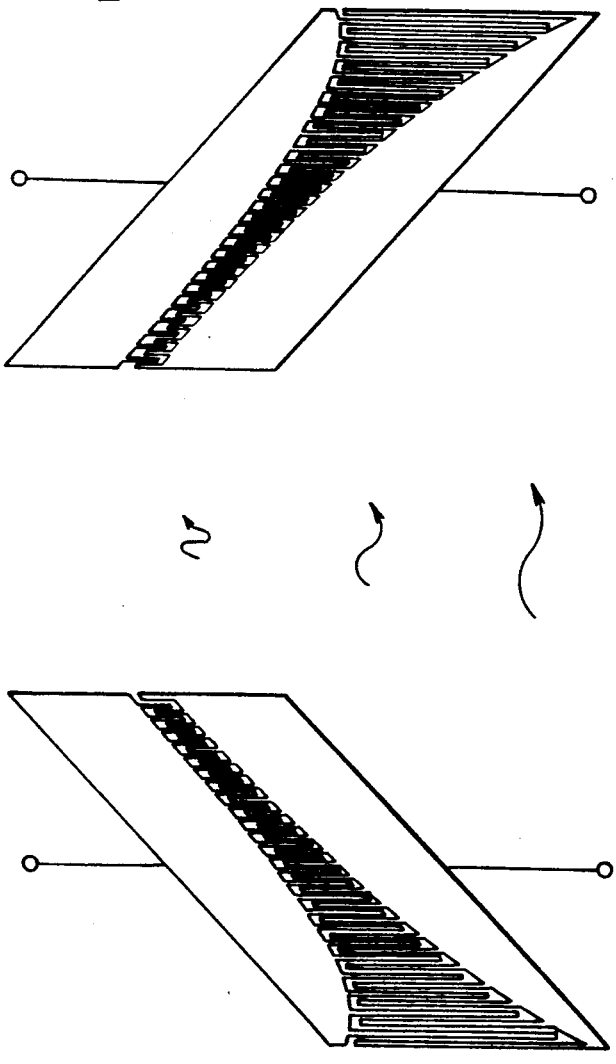
FIG. 6 is a fragmentary plan view of an existing delay line device having a slanted electrode arrangement.

FIG. 1 shows an inventive delay line device so arranged to obtain the substantially same frequency characteristic as that of the dispersive surface acoustic wave delay line device of FIG. 5 and consisting of a pair of parallel delay line elements.

In this drawing, transducers A and A' in one of the delay line elements and transducers B and B' in the other delay line element both formed on a substrate 1 as used in the existing delay line device have mirror relationships, respectively. A region 1a of the transducer A and a region 1b of the transducer B are identical in pitch of electrode finger arrangement, and a region 1a' of the tranducer A' and a region 1b' of the transducer B' are identical in such pitch.

Region-to-region distances (1a-to-1a' distance and 1b-to-1b' distance) are selected so that delay times τa and τb in frequencies having wavelengths corresponding to the same electrode finger pitches in the regions are substantially equal.

Figure 2:
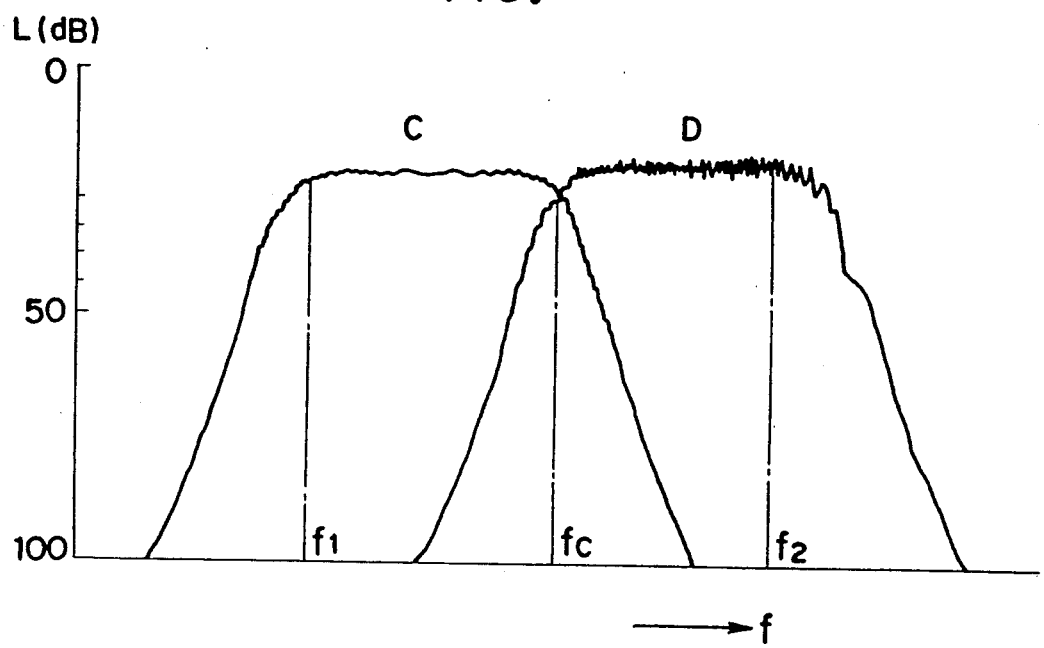
FIG. 2 is a graph showing frequency characteristics of two delay line devices.

FIG. 2 is a graph which shows in an overlapped configuration a frequency characteristic C of the delay line element having the transducers A and A' as its input and output and a frequency characteristic D of the delay line element having the transducers B and B' as its input and output. The frequency characteristics C and D have adjacent frequency bands sharing a frequency fc approximately as the maximum and minimum limits respectively in their 3dB bands. Therefore, electrode fingers with a pitch corresponding to the frequency fc are involved in all the regions 1a, 1a', 1b and 1b'. In FIG. 2, L indicates the insertion loss, and f shows the frequency.

For purposes of suppressing the loss L caused by internal reflections in each transducer and mode transform into a bulk wave, the frequency bands are shared so that frequencies $f_1$ and $f_2$ in relationships at least of one being double or half the other never co-exist in the frequency band of either single delay line element.

Figure 3:
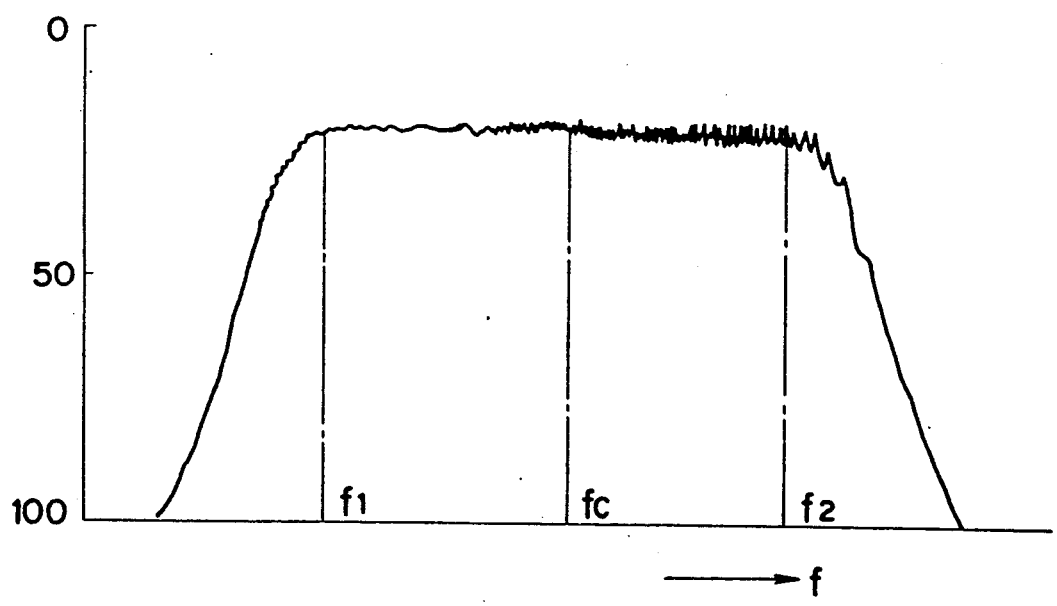
FIG. 3 is a graph showing the frequency characteristic of an inventive delay line device.

A graph of FIG. 3 shows the frequency characteristic of the embodiment in which the said two delay line elements are connected electrically in parallel. Since delay times of the two delay line elements in the frequency fc are substantially equalized, responses near the frequency fc are summed in the same phase, and the loss at the frequency fc in the characteristics C and D is decreased by about 3dB from their maximum values as shown in the graph of FIG. 2. Therefore, in the summed characteristic in the graph of FIG. 3, the response in the vicinity of the frequency fc is smoothed.

Figure 4:
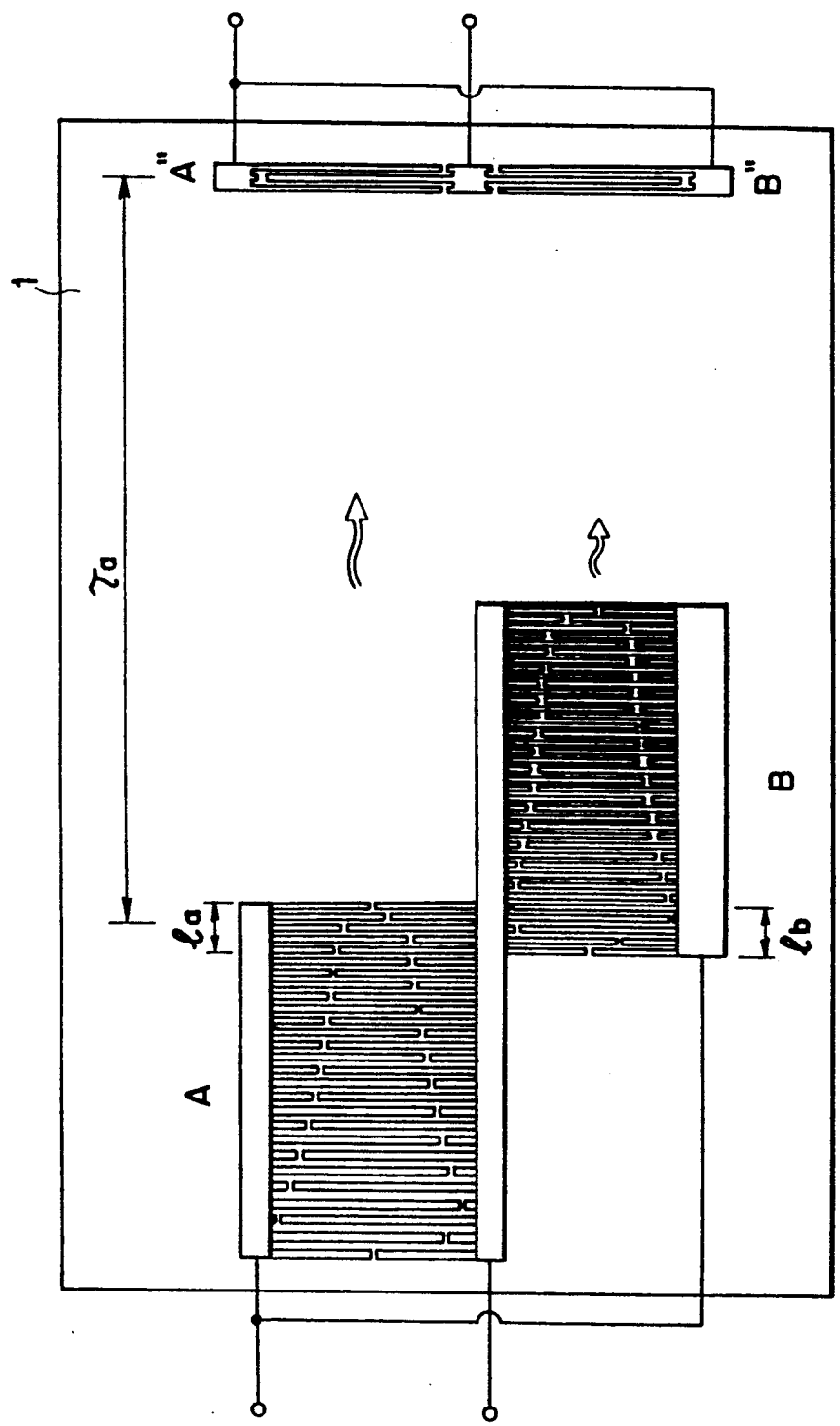
FIG. 4 is a fragmentary plan view of a delay line device taken as a further embodiment of the invention.

FIG. 4 shows a further embodiment of the invention which uses two delay line elements having chirp transducers A and B and wide band regular transducers A'' and B'' as their inputs and outputs. By giving to the frequency characteristics of the respective delay line elements the same conditions as those in the first embodiment, the substantially same effects are obtained.

As described above, according to the invention, a dispersive surface acoustic wave delay line device comprises two or more delay line elements which have frequency characteristics involved in a desired characteristic and are connected in parallel so that they do not share propagation paths. Therefore, a desired continuous frequency characteristic is readily established, and the number of electrode fingers per input or output transducer can be decreased as compared to an arrangement using a single delay line element to obtain the final frequency characteristic of the device. This permits a decrease in the loss caused by internal reflections in each transducer itself and mode transform, and ensures suppression in turbulence in the group delay and phase characteristic caused by changes in the sonic speed under the electrodes.

In particular, by selecting their respective bands so that sets of frequencies in relationships of one being double or half the other do not co-exist in a transducer, it is possible to reinforce the effect of suppressing internal reflections in the transducer.

Further, as compared to a device using a slanted electrode arrangement to realize these effects, the inventive arrangement can reduce the increase in the element size by selecting the least required number of combined delay line elements.

Further, in case of realizing a wider band on a substrate whose sonic speed has a frequency dispersive property, it is very difficult to correct the dispersion throughout a desired band by means of a single transducer. However, the inventive arrangement can divide a desired band into smaller regions and correct the dispersion in respective small bands. Therefore, it is very effective particularly for use in a monolithic surface acoustic wave convolver, etc. using a multi-layer piezoelectric substrate.

What is claimed is:

1. A surface acoustical wave device comprising:
    a piezoelectric substrate; and
    a plurality of dispersive delay line elements formed on said piezoelectric substrate, each element having a dispersive surface acoustic wave input transducer, said input transducers being disposed adjacent to each other and having signal input ends electrically connected in parallel to common input terminals and having respective outlet ends, each delay line element having, aligned along a respective propagation axis relative to an associated input transducer, one of a non-dispersive and a dispersive surface acoustic wave output transducer, all of said output transducers being the same one of a dispersive and a non-dispersive type, said output transducers being disposed adjacent to each other and having output signal ends electrically connected in parallel to common output terminals and having respective inlet ends, said delay line elements being disposed with respective propagation axes being in parallel orientation and offset with respect to each other on said substrate with associated transducer outlet and inlet ends facing each other, each said input and output transducer respectively including intermeshing fingers characterized by respective inter-finger pitch values giving rise to respective transducer response frequencies, said input transducers being disposed staggered with respect to each other along their respective propagation axes so as to provide first mutually overlapping regions extending in side-by side relationship along only portions of adjacent input transducers so that for each pair of adjacent input transducers the inlet end of one input transducer of the pair overlaps the outlet end of the other input transducer of the pair, said output transducers being disposed to provide second mutually overlapping regions extending in side-by-side relationship along at least portions of adjacent output transducers, adjacent transducers having substantially identical inter-finger pitch values with respect to each other along said second mutually overlapping regions, each said delay line element being characterized by a propagation delay time along the propagation axis thereof between first and second regions of mutual overlap with respect to adjacent delay line elements, said input and output transducers being disposed and configured so that the propagation delay times between the first and second mutually overlapping regions of adjacent elements are substantially the same at frequencies corresponding to said identical pitch values.

2. The surface acoustic wave device according to claim 1 wherein said surface acoustic wave delay line elements are configured to have adjacent 3db passbands wherein in each said passband the associated upper 3db frequency is less than twice the associated lower 3db frequency.

3. The surface acoustic wave device according to claim 1 wherein said output transducers are non-dispersive transducers of equal length and are disposed so that associated second overlap regions have said equal extends along their entire length.

4. The surface acoustic wave device according to claim 1 wherein said output transducers are dispersive transducers.

5. The surface acoustic device according to claim 4, said output transducers being disposed staggered with respect to each other along respective propagation axes so as to provide said second mutually overlapping regions extending in side-by side relationship along only portions of adjacent output transducers so that for each pair of adjacent output transducer the inlet end of one output transducer of said pair overlaps the outlet end of the other output transducer of said pair.

6. The surface acoustic wave device of claims 4 or 5 wherein said dispersive transducers are chirp transducers.

* * * * *